US008168477B2

United States Patent
Sun et al.

(10) Patent No.: US 8,168,477 B2
(45) Date of Patent: May 1, 2012

(54) PACKAGING CONFIGURATIONS FOR VERTICAL ELECTRONIC DEVICES USING CONDUCTIVE TRACES DISPOSED ON LAMINATED BOARD LAYERS

(75) Inventors: Ming Sun, Sunnyvale, CA (US); Yueh Se Ho, Sunnyvale, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 12/927,637

(22) Filed: Nov. 18, 2010

(65) Prior Publication Data
US 2011/0076808 A1 Mar. 31, 2011

Related U.S. Application Data

(62) Division of application No. 11/220,759, filed on Sep. 7, 2005, now Pat. No. 7,838,977.

(51) Int. Cl.
*H01L 21/50* (2006.01)
(52) U.S. Cl. ........ 438/125; 257/687; 257/795; 257/686; 257/737; 257/777; 257/778; 257/779; 257/E21.499
(58) Field of Classification Search .......... 257/687, 257/795, 686, 737, 777, 778, 779, E21.499; 438/125
See application file for complete search history.

(56) References Cited

U.S. PATENT DOCUMENTS

| 6,137,164 A * | 10/2000 | Yew et al. ............... 257/686 |
| 6,265,772 B1 * | 7/2001 | Yoshida ............... 257/712 |
| 6,830,959 B2 | 12/2004 | Estacio | |
| 2001/0028114 A1 * | 10/2001 | Hosomi ............... 257/778 |
| 2004/0125577 A1 * | 7/2004 | Vinciarelli et al. ....... 361/778 |
| 2005/0087854 A1 * | 4/2005 | Choi et al. ............... 257/686 |

* cited by examiner

*Primary Examiner* — Marc Armand
(74) *Attorney, Agent, or Firm* — Bo-In Lin (57) ABSTRACT

This invention discloses an electronic package for containing a vertical semiconductor chip that includes a laminated board having a via connector and conductive traces distributed on multiple layers of the laminated board connected to the via connector. The semiconductor chip having at least one electrode connected to the conductive traces for electrically connected to the conductive traces at a different layer on the laminated board and the via connector dissipating heat generated from the vertical semiconductor. A ball grid array (BGA) connected to the via connector functioning as contact at a bottom surface of the package for mounting on electrical terminals disposed on a printed circuit board (PCB) wherein the laminated board having a thermal expansion coefficient in substantially a same range the PCB whereby the BGA having a reliable electrical contact with the electrical terminals.

7 Claims, 5 Drawing Sheets

PACKAGING CONFIGURATIONS FOR VERTICAL ELECTRONIC DEVICES USING CONDUCTIVE TRACES DISPOSED ON LAMINATED BOARD LAYERS

This is a Divisional Application of a previously filed application Ser. No. 11/220,759 filed on Sep. 7, 2005, now U.S. Pat. No. 7,838,977 by identical common inventors of this application. The disclosures made in application Ser. No. 11/220,759 are hereby incorporated by reference in this Patent Application.

BACKGROUND OF THE INVENTION

1. Field of the Invention

The invention disclosed herein relates generally to the process and configuration for packaging integrated circuits, e.g., power MOSFETs. More particularly, this invention relates to a novel and improved method and configuration for simplifying and streamlining the MOSFET package processes to achieve lower production cost, higher packaging throughput and packages with improved reliability.

2. Description of the Prior Art

Conventional technologies and the configurations commonly implemented to package the vertical semiconductor devices, e.g., the power MOSFET devices, still face a problem that a leadframe is commonly used. There is a thermal mismatch between the metal lines of the leadframe and the printed circuit board (PCB) supporting the electronic device and the leadframe. Due to the thermal mismatch, there is a higher failure rate of solder joints. Furthermore, the conventional mechanical structure has several drawbacks such as the unevenness of the die-lead frame system, the limited die size due to the lead frame limitation, and limitation of stress absorption during board level mounting. Current assembly technologies further has another limitation of assembly acceptance difficulty that often causes higher assembly cost and makes it difficult to replace the conventional high volume packages, such as SO, TO and TSSOP package families to reduce the packaging costs. Such difficulty is caused by the fact that these high volume packages cannot be completely packaged by either a lead frame type packaging technology or a regular surface mount assembly technology. Conventional packages further introduce another difficulty in the board level during the pre-assembly and testing processes due to the operations are conducted under a sightless condition of the solder joint area between package and PCB. The leadframe further limits the package to a single die configuration because of the fact that the leadframes do not provide flexibilities to be adaptable to the multiple-chip configuration either as a single module or as an assembly comprised of several modules.

Figure 1A:
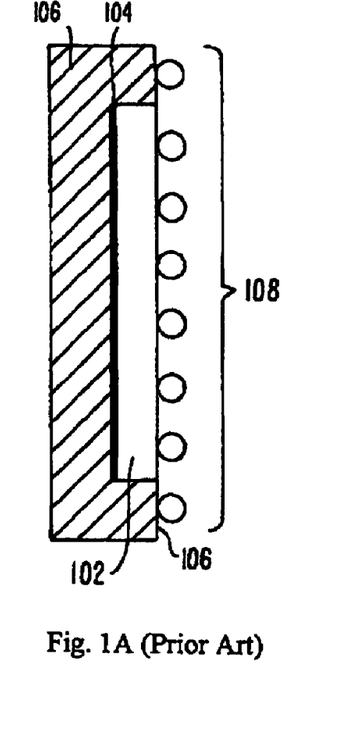
FIGS. 1A to 1D are cross sectional views and perspective views for showing the conventional packaging configurations.

In U.S. Pat. No. 6,133,634 Joshi discloses a semiconductor package as that shown in FIG. 1A. A silicon die 102 is attached to a carrier 106 that has a cavity substantially surrounding the die 102. The cavity dimensions are designed such that the cavity depth is substantially equal to the thickness of die 102 plus the thickness of die attach bond line 104. Direct connection of the active surface of the silicon die to the printed circuit board (PCB) that includes electrical terminals to contact an array of solder bumps distributed across the bottom surface of the die and ball grid array BGA 108 on the bottom edges of the carrier 106 surrounding the die 102. The carrier 106 is formed either as copper or ceramic carrier. Even that this package has the benefits of reducing the package resistance and offers much improved thermal performance, the package has higher production cost due to the requirement to specially manufacture the carrier 106 with specially shaped cavity. Furthermore, due to the geometric shape of the carrier 106, the package as disclosed by Joshi still lacks the flexibility to adapt to different packaging configurations including the multiple-chip module (MCM) configuration.

Figure 1B:
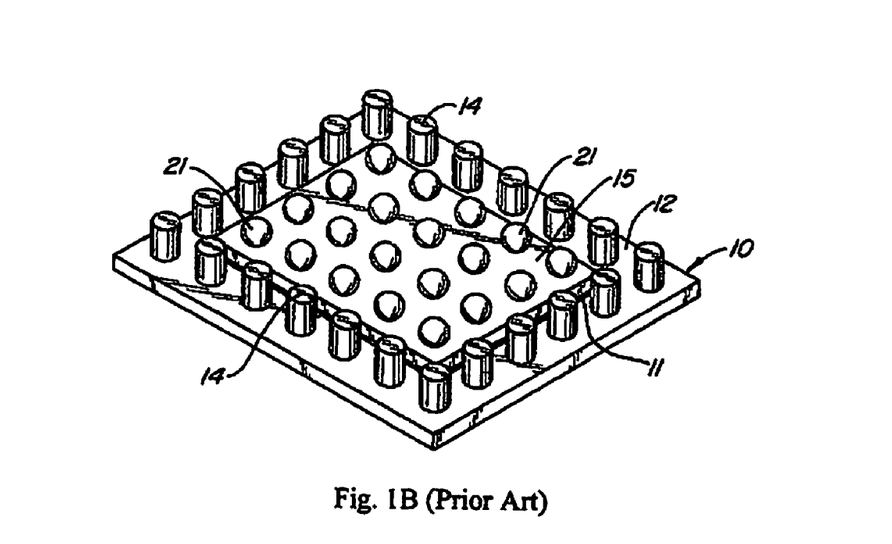
Figure 1C:
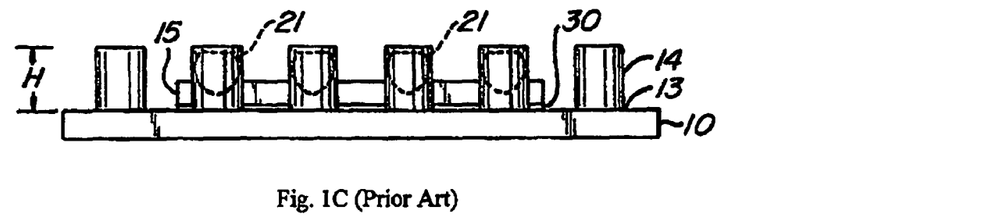

In another U.S. Pat. No. 6,391,687 entitled "Column Ball Grid Array Package", Cabahug et al. disclose a semiconductor device that includes a flat leadframe that includes a die attach area on a surface of the leadframe. A die including solder bumps is placed thereon and the package further includes a plurality of columns surround at least a portion of the periphery of the die attach area. The die is positioned within the die attach area and the columns have a height substantially equal to the solder bumps and the die on the leadframe as that shown in FIGS. 1B and 1C.

Standing et al. disclose in another U.S. Pat. No. 6,624,522 a chip scale package (CSP) that has a semiconductor MOSFET die which has a top electrode surface covered with a layer of a photosensitive liquid epoxy which is photolithographically patterned to expose portions of the electrode surface and to act as a passivation layer and as a solder mask. A solderable contact layer is then formed over the passivation layer. The individual die are mounted drain side down in a metal clip or can with the drain electrode disposed coplanar with a flange extending from the can bottom.

Granada et al. disclose in another U.S. Pat. No. 6,661,082 a chip device that includes a leadframe that has a die attach cavity. The memory device further includes a die that is placed within the die attach cavity. The die attach cavity is substantially the same thickness as the die. The die is positioned within the cavity and is attached therein with a standard die attachment procedure.

Figure 1D:
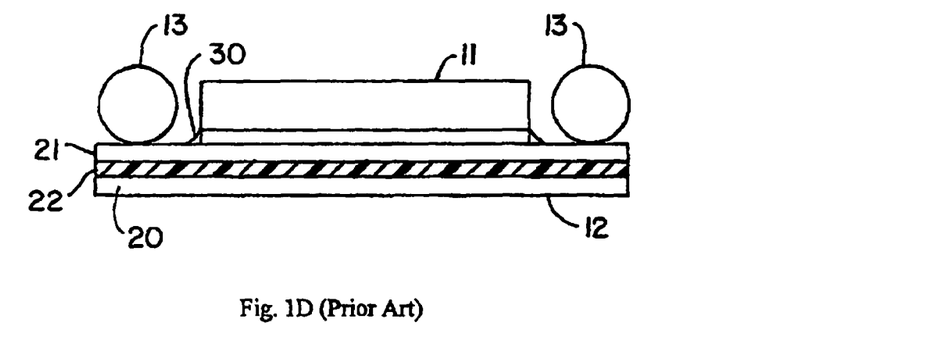

Joshi discloses in another U.S. Pat. No. 6,469,384 a semiconductor device that includes a substrate and a die coupled to the substrate. The MOSFET die is coupled to the substrate such that the source and gate regions of the MOSFET die are coupled to the substrate. Solder balls are provided adjacent to the die such that when the semiconductor device is coupled to a printed circuit board, the exposed surface of the serves as the drain connections while the solder balls serve as the source and gate connections. As shown in FIG. 1D, the substrate includes a base layer 20 and a top, metal layer 21. The base layer and the top metal layer are separated by an insulting layer 22 that may be an insulating epoxy to join the two layers. The base material may comprise a metallized pattern while the top metal layer preferably comprises another metallized pattern. The metal layer may also serve as a heat spreader. However, since the at least one or two layers of this multi-layered substrate is composed of metal, the problem of thermal expansion mismatches between the metal layer and the printed circuit board for supporting the package would still cause thermal stresses. The package is still limited by a reliability problem when operated under thermally challenging environment. Furthermore, the substrate is still manufactured with specially design processes for the purpose of forming the metal layers. The production costs are therefore increased due to the special manufacturing requirements of the package substrate as disclosed in this patented invention.

The above patented disclosures however do not provide a practical solution to overcome the limitations and difficulties as now encountered by a person of ordinary skill in the art of semiconductor device packaging design and manufactures. Therefore, a need still exists in the art to provide a new and improved configuration and methods to package a vertical semiconductor device such that the above discussed problems and difficulties can be resolved.

SUMMARY OF THE PRESENT INVENTION

It is therefore an object of the present invention to provide an improved configuration for packaging a vertical semiconductor device such as a MOSFET device by forming interconnecting traces in laminated layers. The laminated layers are composed of materials that have similar coefficient of thermal expansion as that of printed circuit board and reduces thermal mismatch problems.

It is another aspect of this invention that the laminated multi-layer carrier such as a PCB or flexible board formed with interconnecting traces improves the yield of packaging processes and produces packages with improved long term reliability. The packaging configuration further provides more flexibly adjustable die size without being limited by specially processed die-attaching carriers formed with special cavity or shapes and sizes with extended edges as that shown above. With commonly available PCB technologies now applied in semiconductor packaging processes, another aspect of this invention is that the configuration disclosed in this invention can be conveniently implemented as a surface mount technology (SMT) package. Because of the flexibility and adaptability of the configuration, the packaging configuration of the present invention can be a convenient replacement of conventional packages such as packaging families of SO, TSSOP and TO. Another aspect of this invention is the improvement that the process has improved sight to the solder joint area thus significantly improves the convenience and manufacturability of the packaging processes.

Another aspect of the present invention is to provide an improved configuration for packaging a MOSFET device with available multiple chips packaging on the same layer thus resolve the above-discussed limitations and difficulties of the conventional packaging configurations.

Another aspect of this invention is to provide a configuration that enables a packaging process by stacking dies or packages to two or more layers because the interconnecting traces are now disposed in the laminated layers now are integrated as part of the package. Compared to the packages implemented with leadframes, when implemented with the packaging configuration as disclosed in this invention, the arrangements and interconnections between the integrated circuit (IC) chips have much greater degrees of freedom. Exemplary embodiments may include multiple-chip modules are configured as all sources and gates are arranged to face down or all drains are arranged to face down or combinations of some drains facing down while some sources and gates are configured to face down.

Briefly in a preferred embodiment this invention discloses package containing a metal oxide semiconductor field effect transistor (MOSFET) device. The package further includes an electronic package for containing a vertical semiconductor chip. The package includes a laminated board having a via connector and conductive traces distributed on multiple layers of the laminated board connected to the via connector. The semiconductor chip having at least one electrode connected to the conductive traces for electrically connected to the conductive traces at a different layer on the laminated board and the via connector dissipating heat generated from the vertical semiconductor. In a preferred embodiment, the package further includes a ball grid array (BGA) connected to the via connector functioning as contact at a bottom surface of the package for mounting on electrical terminals disposed on a printed circuit board (PCB) wherein the laminated board having a thermal expansion coefficient in substantially a same range the PCB whereby the BGA having a reliable electrical contact with the electrical terminals. In a preferred embodiment, the vertical semiconductor chip further includes solder bumps extended from the semiconductor chip at substantially a same horizontal plane as the BGA for conveniently mounting onto terminals disposed on a print circuit board. In a preferred embodiment, the vertical semiconductor chip further includes solder bumps connected to the via connector for electrically connecting to the BGA and the vertical semiconductor chip attached to the laminated board as a flip chip having a bottom electrode attached to a back surface of the semiconductor chip having substantially a same horizontal plane for conveniently mounting together with the BGA onto terminals disposed on a print circuit board. In a preferred embodiment, the vertical semiconductor chip is a metal oxide semiconductor field effect transistor (MOSFET) chip. In a preferred embodiment, the MOSFET chip having a drain electrode connected to the conductive traces for electrically connected to the conductive traces at a top layer on the laminated board and the via connector dissipating heat generated from the MOSFET chip. In a preferred embodiment, the package further includes a ball grid array (BGA) connected to the via connector functioning as drain contact for the MOSFET chip at a bottom surface of the package. In a preferred embodiment, the MOSFET chip further includes solder bumps extended from the MOSFET chip at substantially a same horizontal plane as the BGA for conveniently mounting onto terminals disposed on a print circuit board. In a preferred embodiment, the MOSFET chip further includes solder bumps as source and gate contacts connected to the via connector for electrically connecting to the BGA and the vertical semiconductor chip attached to the laminated board as a flip chip having a drain electrode attached to a back surface of the MOSFET chip having substantially a same horizontal plane as the BGA for conveniently mounting together with the BGA onto terminals disposed on a print circuit board.

This invention further discloses a method for enhancing a heat dissipation of a MOSFET package. The method includes a step of distributing a plurality of conductive traces on multiple layers of a laminated board and connecting the conductive traces disposed on different layers with a via connector penetrating through the multiple layers. The method further includes a step of connecting at least one electrode of the MOSFET device to the conductive traces for electrically connected to conductive traces at different layer of the laminated board for dissipating heat through the via connector and the conductive traces. In a preferred embodiment, the method further includes a step of connecting a ball grid array (BGA) to the via connector functioning as contact at a bottom surface of the MOSFET package. In a preferred embodiment, the method further includes a step of connecting a ball grid array (BGA) to the via connector functioning as contact at a bottom surface of the package. The method further includes a step of mounting the MOSFET package with the BGA mounted on electrical terminals disposed on a printed circuit board (PCB) wherein the laminated board having a thermal expansion coefficient in substantially a same range the PCB whereby the BGA having a reliable electrical contact with the electrical terminals. In a preferred embodiment, the method further includes a step of forming solder bumps on the MOSFET chip with the solder bumps extended from the semiconductor chip at substantially a same horizontal plane as the BGA for conveniently mounting onto terminals disposed on a print circuit board. In a preferred embodiment, the method further includes a step of forming solder bumps on the MOSFET chip for connecting to the via connector for electrically connecting to the BGA. The method further includes a step of attaching the MOSFET chip to the laminated board as a flip chip having a bottom electrode attached to a back surface of the MOSFET chip having substantially a same horizontal plane for conveniently mounting together with the BGA onto terminals disposed on a print circuit board. In a preferred embodiment, the method further includes a step of connecting a drain electrode of the MOSFET chip to the conductive traces for electrically connected to the conductive traces at a top layer on the laminated board and the via connector dissipating heat generated from the MOSFET chip. In a preferred embodiment, the method further includes a step of connecting a ball grid array (BGA) to the via connector functioning as drain contact for the MOSFET chip at a bottom surface of the package. In a preferred embodiment, the method further includes a step of forming solder bumps on the MOSFET chip with the solder bumps extended from the MOSFET chip at substantially a same horizontal plane as the BGA for conveniently mounting onto terminals disposed on a print circuit board. In a preferred embodiment, the step of forming solder bumps on the MOSFET chip further includes solder bumps as source and gate contacts connected to the via connector for electrically connecting to the BGA and attaching the MOSFET chip to the laminated board as a flip chip having a drain electrode attached to a back surface of the MOSFET chip having substantially a same horizontal plane as the BGA for conveniently mounting together with the BGA onto terminals disposed on a print circuit board.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 2A:
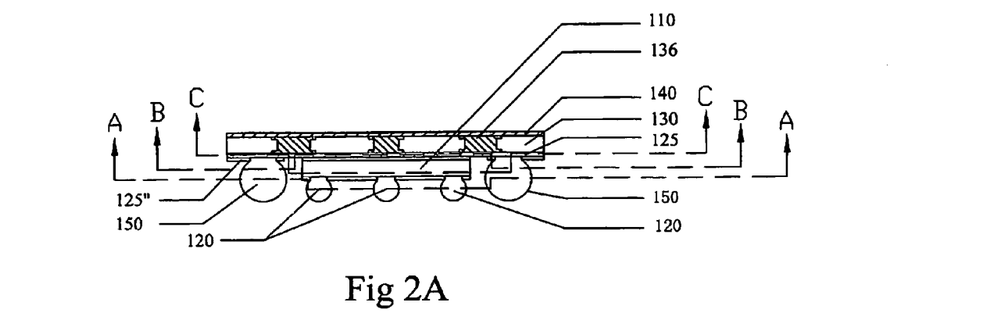
FIGS. 2A to 2D are side cross sectional view and top and bottom view of an improved packaging configuration of a MOSFET device of this invention.
Figure 2B:
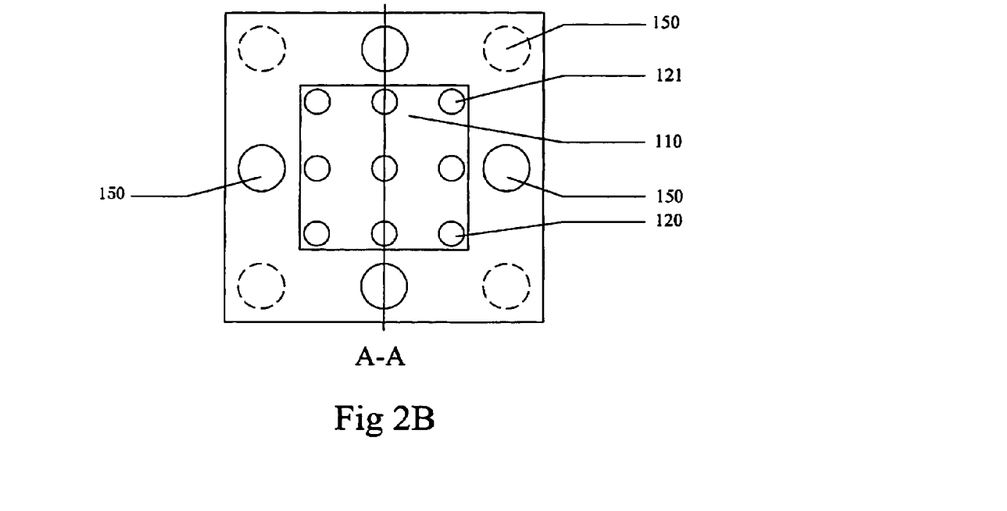

Referring to FIGS. 2A and 2B for a side cross sectional view and a bottom view of a new MOSFET package 100 of this invention. The MOSFET package 100 includes a MOSFET semiconductor chip 110 that has a plurality of solder bumps 120. The solder bumps 120 are in electrical contact to the gate pads and source pads disposed on the top surface of the MOSFET chip 110. A plurality of copper traces 125 is connected to the drain contact disposed on the bottom surface of the MOSFET chip 110. A copper plate 125' is electroplated to a laminated board, e.g., a printed circuit board (PCB) 130, that has a plurality of via connector filled with copper 135 therein. A top copper plate 140 is further electroplated to the top surface of the laminated board, e.g., the PCB 130. A ball grid array (BGA) that includes a plurality of solder balls 150 is disposed on the bottom surface of the PCB 130. The balls 150 of the BGA are in electric contact with the via-connectors 135.

Figure 2C:
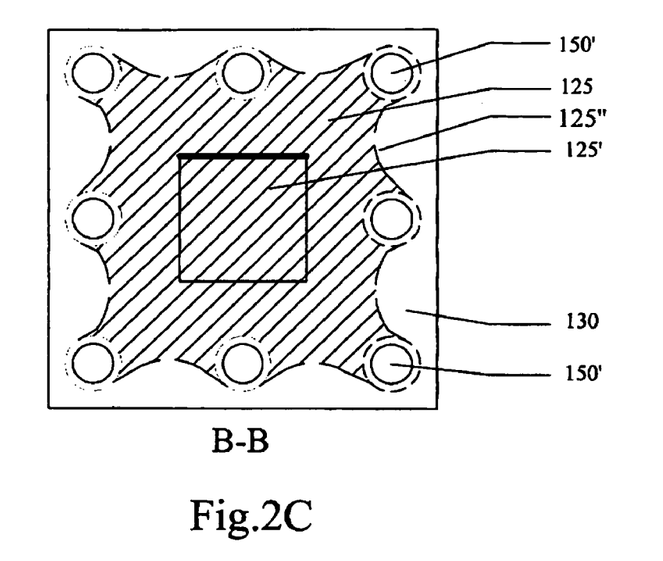
Figure 2D:
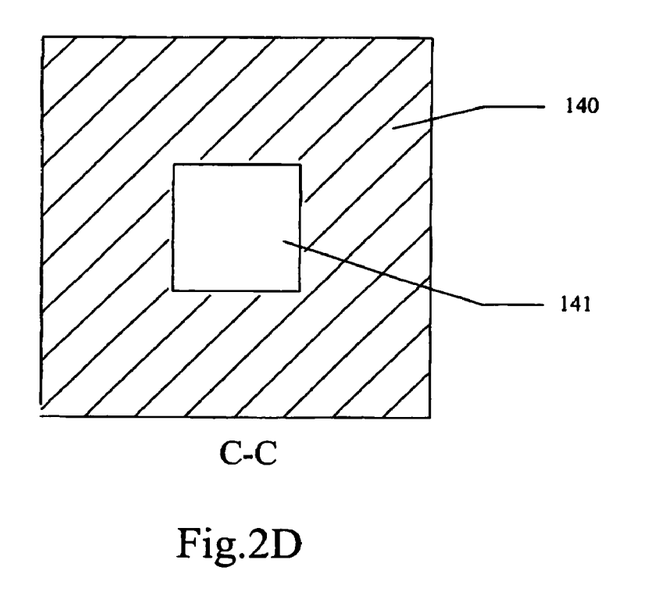

Referring to FIGS. 2C and 2D for a bottom view at the bottom of the PCB 130 along the line A-A as that shown in FIG. 2A. The bottom surface of the PCB 130 has a copper plate 125' electroplated to the bottom surface of the PCB 130 to attach the drain of the MOSFET 110 to the copper plate 125'. The remainder of the areas of the bottom surface of the PCB 130 is covered by a solder mask 125" to form the cooper traces 125 that extends from the copper plate 125' to the BGA pads 150' for soldering the BGA balls 150 thereon. The BGA pads 150's is further electrically connected to the via connector 135 with copper filled in the via openings formed in the PCB board 130. Referring to FIG. 2D for a top view of the package that has a copper layer 135 with the center portion etched off.

Figure 3A:
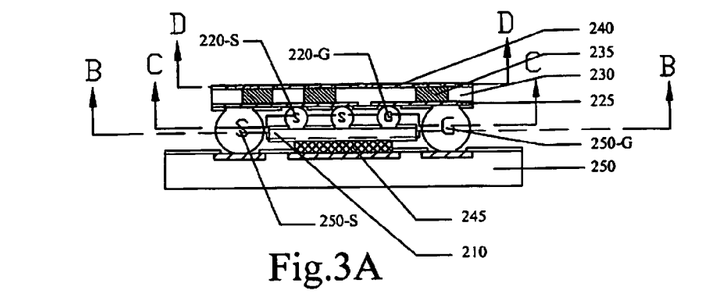
FIGS. 3A to 3D are side cross sectional view and top and bottom view of another improved packaging configuration of a MOSFET device of this invention.
Figure 3B:
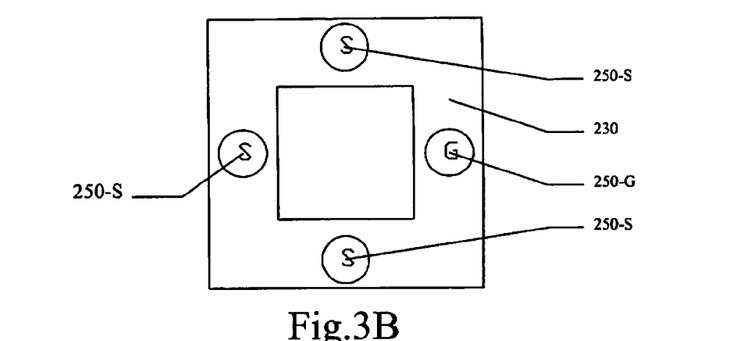

Referring to FIGS. 3A and 3B for a side cross sectional view and a bottom view of a new MOSFET package 200 of this invention. The MOSFET package 200 includes a MOSFET semiconductor chip 210 is packaged as a flip chip with a configuration where a plurality of solder bumps 220 are attached to solder pads formed on the bottom surface of a laminated multi-layer substrate carrier, e.g., a PCB board carrier 230. The solder bumps 220-G are in electrical contact to the gate pad 225-GP that is soldered to a gate solder ball 250-G. The solder bumps 220-S are in electrical contact to the source pads 225-SP with each source pad 225-SP soldered to a source solder ball 250-S. A drain contact 245 is formed on the bottom surface of the MOSFET chip 210 with the bottom surface of the drain contact 245 aligned to have about a same elevation as the gate and source solder balls 25-G and 250-S respectively. The package 200 is therefore ready for further implementation as a SMT (surface mount technology) package commonly supported by a PCB carrier 250 to connect to other electronic devices (not shown) supported on the PCB carrier 250 as a multiple-chip module (MCM). Since the laminated multiple layer substrate carrier 230 has about the same thermal expansion coefficient as the PCB carrier, the package 200 has much improved solder joint reliability.

Figure 3C:
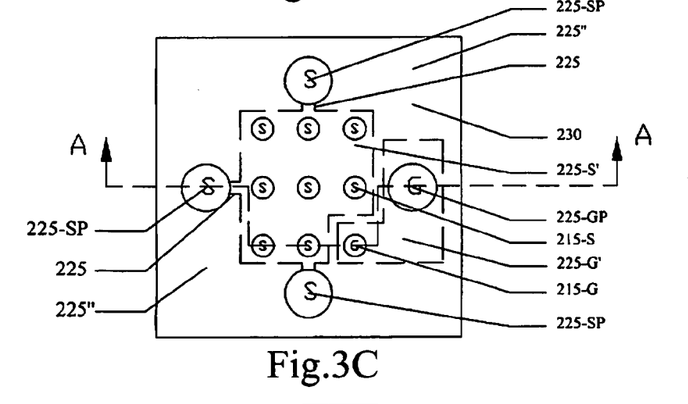
Figure 3D:
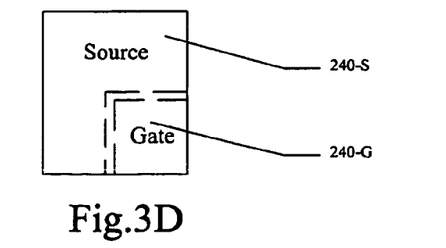

Referring to FIG. 3C for a bottom view at the bottom of the PCB 230 along the line A-A as that shown in FIG. 3A. The bottom surface of the PCB 230 has a solder mask with solder bump openings 215-S and 215-G electroplated to the bottom surface of the PCB 230 to attach the solder bumps 220-G and 220-S of the MOSFET 210 to the copper plate 225-S and 225-G'. The remainder of the areas of the bottom surface of the PCB 230 is covered by a solder mask 225" to form the copper traces 225 that extends from the copper plate 225-G' and 225-S' to the BGA gate pad 225-G' and the source gate pad s225-S' for soldering the BGA gate balls 250G and 250S thereon. The BGA pads 150's is further electrically connected to the source balls via connector 235 with copper filled in the via openings formed in the PCB board 230. Referring to FIG. 2D for a top view of the package that has a copper layer 240S and 240G formed on the top of the package as source and gate contact pads for external connections.

According to above descriptions, this invention further disclose a method for reducing a thermally induced stress between a package and a print circuit board (PCB) wherein the package containing a vertical semiconductor chip with the package mounted onto the print circuit board (PCB). The method includes a step of distributing a plurality of conductive traces on multiple layers of a laminated board and connecting the conductive traces disposed on different layers with a via connector penetrating through the multiple layers. The method further includes a step of connecting electrodes of the vertical semiconductor chip to the conductive traces for electrically connected to conductive traces at different layer of the laminated board for electrically connecting to a ball grid array and solder bumps wherein the BGA and the solder bumps mounted onto the PCB with the laminated board having a thermal expansion coefficient substantially in a same range as the PCB whereby the thermally induced stress is reduced Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for enhancing a heat dissipation of a MOSFET package for containing a MOSFET chip having a flat surface electrode, the method comprising:

distributing a plurality of conductive traces on multiple layers of a laminated board and connecting said conductive traces disposed on different layers to a via connector penetrating through said multiple layers with said via connector further connected to a top and bottom patterned metal plates and forming a solder mask covering over an extensive area on a bottom surface of said laminating board next to the bottom patterned metal plate;

face-to-face attaching said flat-surface electrode of said MOSFET chip to said bottom patterned metal plate of said laminated board for dissipating heat generated by said MOSFET chip through said bottom patterned metal plate and said via connector and said conductive traces;

forming said electronic package with a plurality of ball grid array (BGA) solder pads disposed at outer edges of said soldering surface separated from said solder mask and a plurality of solder balls soldered onto said BGA solder pads disposed on the outer edges of the soldering surface; and forming solder bumps on said MOSFET chip extend vertically from a top surface opposite said flat-surface electrode of said MOSFET chip and extended vertically upward to substantially a same vertical level as said solder balls for conveniently mounting together with said solder balls onto terminals disposed on a top-mounting print circuit board.

2. The method of claim 1 further comprising:
mounting said MOSFET package with some solder balls of said BGA mounted on electrical terminals disposed on a printed circuit board (PCB) wherein said laminated board having a thermal expansion coefficient in substantially a same range said PCB whereby said BGA having a reliable electrical contact with said electrical terminals.

3. The method of claim 1 further comprising:
connecting a drain electrode of said MOSFET chip as said flat-surface electrode to said conductive traces by face-to-face attaching onto said bottom patterned metal plate for electrically connected to said conductive traces at a top layer on said laminated board for dissipating heat generated from said MOSFET chip.

4. The method of claim 1 further comprising:
face-to-face attaching a drain electrode as said flat-surface electrode of said MOSFET chip to said bottom patterned metal plate for connecting a ball grid array (BGA) to said via connector for functioning as drain contact for said MOSFET chip at a bottom surface of said package.

5. A method for enhancing a heat dissipation of a MOSFET package for containing a MOSFET chip having a flat surface electrode, the method comprising:

distributing a plurality of conductive traces on multiple layers of a laminated board and connecting said conductive traces disposed on different layers to a via connector penetrating through said multiple layers with said via connector further connected to a top and bottom patterned metal plates and forming a solder mask covering over an extensive area on a bottom surface of said laminating board next to the bottom patterned metal plate;

face-to-face attaching said flat-surface electrode of said MOSFET chip to said bottom patterned metal plate of said laminated board for dissipating heat generated by said MOSFET chip through said bottom patterned metal plate and said via connector and said conductive traces; and forming solder bumps on said MOSFET chip with said solder bumps extended vertically from a source and a gate terminals from said MOSFET chip at substantially a same horizontal plane as solder balls of said BGA soldered onto BGA solder pads electrically connected to the drain electrode for conveniently mounting onto terminals disposed on a print circuit board.

6. A method for enhancing a heat dissipation of a MOSFET package for containing a MOSFET chip having a flat surface electrode, the method comprising:

distributing a plurality of conductive traces on multiple layers of a laminated board and connecting said conductive traces disposed on different layers to a via connector penetrating through said multiple layers with said via connector further connected to a top and bottom patterned metal plates and forming a solder mask covering over an extensive area on a bottom surface of said laminating board next to the bottom patterned metal plate;

face-to-face attaching said flat-surface electrode of said MOSFET chip to said bottom patterned metal plate of said laminated board for dissipating heat generated by said MOSFET chip through said bottom patterned metal plate and said via connector and said conductive traces; and forming solder bumps on said MOSFET chip with said solder bumps extended from said MOSFET chip at substantially a same horizontal plane as said solder balls soldered onto said BGA solder pads for conveniently mounting onto terminals disposed on the print circuit board; and forming said solder bumps as source and gate contacts connected to said via connector for electrically connecting to said BGA and attaching said MOSFET chip to said laminated board as a flip chip having a drain electrode as a back surface of said MOSFET chip having substantially a same horizontal plane as said BGA for conveniently mounting together with said BGA onto terminals disposed on a print circuit board.

7. A method for reducing a thermally induced stress between a package and a print circuit board (PCB) where in said package containing a vertical semiconductor chip having a flat surface electrode with said package mounted onto said print circuit board (PCB), the method comprising:

distributing a plurality of conductive traces on multiple layers of a laminated board and connecting said conductive traces disposed on different layers to a via connector penetrating through said multiple layers with said via connector further connected to a top and bottom patterned metal plates and forming a solder mask covering over an extensive area on a bottom surface-of said laminating board next to the bottom patterned metal plate; and face-to-face attaching said flat-surface electrode of said vertical semiconductor chip to said bottom patterned metal plate of said laminated board for electrically connecting to a ball grid array and solder bumps wherein said BGA and said solder bumps mounted onto said PCB with said laminated board having a thermal expansion coefficient substantially in a same range as said PCB whereby said thermally induced stress is reduced.

\* \* \* \* \*